(12) United States Patent
Wu

(10) Patent No.: US 11,081,516 B2
(45) Date of Patent: Aug. 3, 2021

(54) DISPLAY SCREEN, ELECTRONIC DEVICE AND METHOD FOR THREE-DIMENSIONAL FEATURE RECOGNITION

(71) Applicant: GUANGDONG OPPO MOBILE TELECOMMUNICATIONS CORP., LTD., Guangdong (CN)

(72) Inventor: Anping Wu, Guangdong (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 143 days.

(21) Appl. No.: 16/533,188

(22) Filed: Aug. 6, 2019

(65) Prior Publication Data

US 2020/0052030 A1 Feb. 13, 2020

(30) Foreign Application Priority Data

Aug. 10, 2018 (CN) .......................... 201810914142.7
Aug. 10, 2018 (CN) .......................... 201821295039.0

(51) Int. Cl.
*H01L 27/146* (2006.01)
*G06T 7/73* (2017.01)

(52) U.S. Cl.
CPC .......... *H01L 27/14649* (2013.01); *G06T 7/73* (2017.01); *G06T 2207/10028* (2013.01); *G06T 2207/30201* (2013.01)

(58) Field of Classification Search
CPC ................. H01L 27/14649; G06T 7/73; G06T 2207/10028; G06T 2207/30201
See application file for complete search history.

(56) References Cited

U.S. PATENT DOCUMENTS

| 2006/0244693 A1* | 11/2006 | Yamaguchi | G06F 3/042 345/76 |
| 2007/0018915 A1* | 1/2007 | Tang | G09G 3/3225 345/76 |

(Continued)

FOREIGN PATENT DOCUMENTS

| CN | 106980460 A | 7/2017 |
| CN | 107844247 A | 3/2018 |

(Continued)

OTHER PUBLICATIONS

European search report, EP19190662.7, dated Dec. 10, 2019.

(Continued)

*Primary Examiner* — Blake C Riddick
(74) *Attorney, Agent, or Firm* — Perkins Coie LLP

(57) ABSTRACT

A display screen, an electronic device and a method for 3D feature recognition are provided. The display screen includes a plurality of display units distributed in an array across a display area of the display screen; a plurality of infrared emitting elements embedded in a first area of the display area of the display screen; and a plurality of photosensitive elements embedded in a second area of the display area of the display screen. The plurality of photosensitive elements can be combined into an image sensor. The plurality of infrared emitting elements is configured to emit infrared light for illuminating a target object in front of the display screen so as to form a plurality of light spots on the target object. The plurality of photosensitive elements is configured to receive target light spots reflected from the target object and convert the target light spots into photo-electrical signals for generating a target image of the target object.

8 Claims, 6 Drawing Sheets

(56) References Cited

U.S. PATENT DOCUMENTS

| | | | |
|---|---|---|---|
| 2010/0110088 A1 | 5/2010 | Lee et al. | |
| 2014/0085245 A1* | 3/2014 | Baldwin | G06F 3/0488 |
| | | | 345/174 |
| 2015/0083817 A1* | 3/2015 | Kim | G06F 3/011 |
| | | | 239/1 |
| 2015/0253428 A1* | 9/2015 | Holz | G01S 17/36 |
| | | | 356/5.01 |
| 2015/0364107 A1 | 12/2015 | Sakariya et al. | |
| 2016/0309135 A1* | 10/2016 | Ovsiannikov | H04N 5/23245 |
| 2018/0031672 A1* | 2/2018 | Bruder | H04N 5/351 |
| 2018/0198980 A1 | 7/2018 | Takagi et al. | |
| 2019/0129510 A1* | 5/2019 | Wang | G06K 9/00355 |
| 2020/0293757 A1* | 9/2020 | Nilsson | H04N 5/232 |
| 2020/0348385 A1* | 11/2020 | Schindler | G01S 7/481 |
| 2020/0371237 A1* | 11/2020 | Schindler | G01S 7/4802 |
| 2021/0036047 A1* | 2/2021 | Heo | H01L 51/5278 |

FOREIGN PATENT DOCUMENTS

| | | |
|---|---|---|
| CN | 107946338 A | 4/2018 |
| CN | 207233359 U | 4/2018 |
| CN | 109040363 A | 12/2018 |

OTHER PUBLICATIONS

International search report, PCT/CN2019/100089, dated Oct. 29, 2019.

Examination Report dated Oct. 29, 2020 of European Patent Application No. 19 190 662.7 (5 pages).

IPI, Examination Report for Indian Patent Application No. 201914032162, dated Jan. 20, 2021. 6 pages.

\* cited by examiner

DISPLAY SCREEN, ELECTRONIC DEVICE AND METHOD FOR THREE-DIMENSIONAL FEATURE RECOGNITION

CROSS-REFERENCE TO RELATED APPLICATIONS

This application claims priority to Chinese Patent Application No. 2018109141427, filed on Aug. 10, 2018, and No. 2018212950390 filed on Aug. 10, 2018, the disclosure of which are hereby incorporated by reference in its entirety.

TECHNICAL FIELD

The present disclosure relates to the field of electronic technology, and more particularly to a display screen, an electronic device and a method for three-dimensional feature recognition.

BACKGROUND

In related art, identification components such as an infrared emitter and an infrared camera for performing three-dimensional (3D) feature (such as 3D face feature) recognition generally need to be disposed outside an display area of an electronic device, so that a non-display area needs to be reserved to dispose these components, which limited a further increasing of the display area.

SUMMARY

In an aspect of the present disclosure, a display screen is provided. The display screen includes a plurality of display units distributed in an array across a display area of the display screen, a plurality of infrared emitting elements embedded in a first area of the display area, and a plurality of photosensitive elements embedded in a second area of the display area of the display screen. The plurality of infrared emitting elements is configured to emit infrared light for illuminating a target object in front of the display screen so as to form a plurality of light spots on the target object. The plurality of photosensitive elements is configured to receive target light spots reflected from the target object and convert the target light spots into photo-electrical signals suitable for generating a target image of the target object.

In another aspect of the present disclosure, an electronic device is further provided. The electronic device includes a display screen and a processor. The display screen includes a plurality of display units distributed in an array across a display area of the display screen, a plurality of infrared emitting elements embedded in a first area of the display area, and a plurality of photosensitive elements embedded in a second area of the display area. The plurality of infrared emitting elements is configured to emit infrared light for illuminating a target object in front of the display screen so as to form a plurality of light spots on the target object. The plurality of photosensitive elements is configured to receive target light spots reflected from the target object and convert the target light spots into photo-electrical signals. The processor is electrically connected to the plurality of photosensitive elements, and configured to perform an image processing operation to obtain a target image according to the photo-electrical signals generated by the plurality of photosensitive elements, and to identify one or more 3D features of the target object according to the target image.

In an additional aspect of the present disclosure, a 3D feature recognition method is provided. The method includes emitting infrared light by a plurality of infrared emitting elements of a display screen to illuminate a target object in front of the display screen so as to form a plurality of light spots on the target object, receiving, by a plurality of photosensitive elements of the display screen, target light spots reflected from the target object, converting the target light spots into photo-electrical signals by the plurality of photosensitive elements, performing an image processing operation to obtain a target image according to the photo-electrical signals generated by the plurality of photosensitive elements, and identifying one or more 3D features of the target object according to the target image.

BRIEF DESCRIPTION OF THE DRAWINGS

In order to describe more clearly technical solutions of the present disclosure, the following will give a brief introduction to the accompanying drawings related to embodiments of the present disclosure. Apparently, the following accompanying drawings merely illustrate some embodiments of the present disclosure. Those of ordinary skill in the art can also obtain other accompanying drawings based on the following accompanying drawings without making creative effort.

DETAILED DESCRIPTION

In the following, embodiments of the present disclosure will be elaborated with reference to the accompanying drawings.

Figure 1:
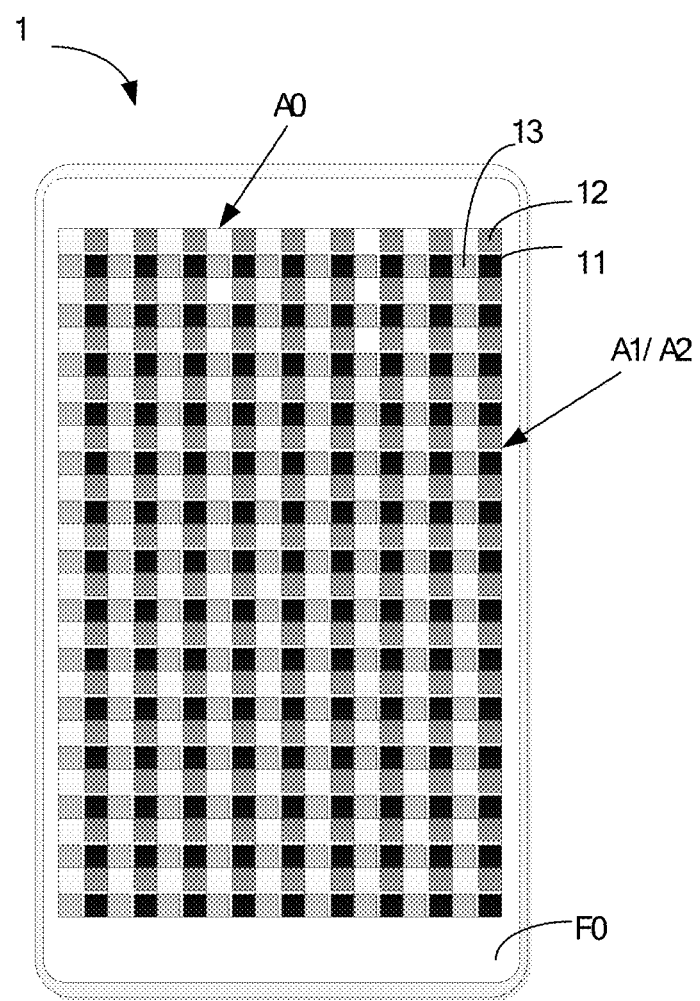
FIG. 1 is a schematic structural diagram illustrating a display screen according to an embodiment of the present disclosure.

FIG. 1 is a schematic structural diagram illustrating a display screen 1 according to an embodiment of the present disclosure.

As illustrated in FIG. 1, the display screen 1 includes a display area A0. A plurality of display units 11 is distributed in an array throughout the display area A0 of the display screen 1. A plurality of infrared emitting elements 12 is embedded in a first area A1 of the display area A0 of the display screen 1, and a plurality of photosensitive elements 13 is embedded in a second area A2 of the display area A0 of the display screen 1. The plurality of photosensitive elements 13 is combined into an image sensor.

The plurality of infrared emitting elements 12 is configured to emit infrared light for illuminating a target object in front of the display screen 1, such that a plurality of light spots is formed on the target object. The plurality of photosensitive elements 13 is configured to receive target light spots reflected from the target object in response to the plurality of light spots and convert the target light spots into photo-electrical signals suitable for generating a target image for identifying 3D feature of the target object. The target light spots may include a plurality of reflecting light spots reflected by the target object in response to the plurality of light spots.

In the present disclosure, a 3D feature recognition assembly, such as the plurality of infrared emitting elements 12 and the plurality of photosensitive elements 13, is embedded in the display area A0 of the display 1. As a result, there is no need to reserve extra non-display area to place the 3D feature recognition assembly, which can increase screen to body ratio of the display screen effectively and meet the needs of 3D feature recognition such as 3D face feature recognition.

Figure 2:
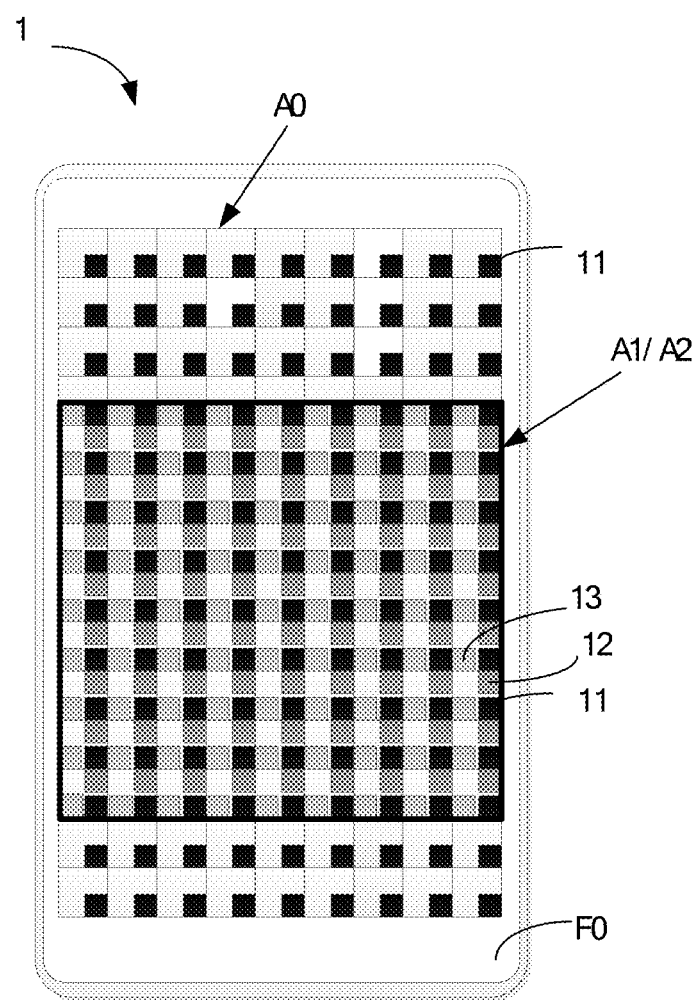
FIG. 2 is a schematic structural diagram illustrating a display screen according to another embodiment of the present disclosure.

In one embodiment, the first area A1 and the second area A2 overlap to form an overlapped area. In some embodiments, the first area A1 and the second area A2 completely overlap with each other (e.g., as shown in FIG. 1-2). In some embodiments, the size of the overlapped area may be greater than or equal to half of the size of the display area A0.

In one embodiment, the plurality of infrared emitting elements 12 and the plurality of photosensitive elements 13 are embedded in the same area of the display area A0 of the display 1, and distributed in at least half of the display area A0.

In one embodiment, as illustrated in FIG. 1, the first area A1 and the second area A2 overlap with the display area A0, which means the plurality of infrared emitting elements 12 and the plurality of photosensitive elements 13 are embedded in entire of the display area A0.

As illustrated in FIG. 2, in one embodiment, the size of the overlapped area may be smaller than the size of the display area A0 and greater than or equal to half of the size of the display area A0. The overlapped area may be located in any position of the display area A0, and the size of the overlapped area may be greater than or equal to half of the size of the display area A0.

By way of example, as illustrated in FIG. 2, the overlapped area may be located in a center area of the display area A0. As an example, the overlapped area may be located in an area close to the end of the display area A0. The size of the overlapped area may be greater than or equal to half of the size of the display area A0.

As illustrated in FIG. 1 and FIG. 2, in the overlapped area, each of the display units 11 includes an infrared emitting element 12 and a photosensitive element 13, which means in the overlapped area, the number of the infrared emitting element 12 and the number of the photosensitive element 13 are equal to the number of the display units 11.

In one embodiment, the number of the infrared emitting element 12 and the number of the photosensitive element 13 may be equal to each other, and greater or smaller than the number of the display unit 11. By way of example, an infrared emitting element 12 and a photosensitive element 13 may correspond to every two of the display units 11. As another example, two infrared emitting elements 12 and two photosensitive elements 13 correspond to each of the display units 11.

In another embodiment, in the overlapped area, the number of the infrared emitting element 12 and the number of the photosensitive element 13 may be different. By way of example, the number of the infrared emitting element 12 may be greater or smaller than the number of the photosensitive element 13.

Figure 3:
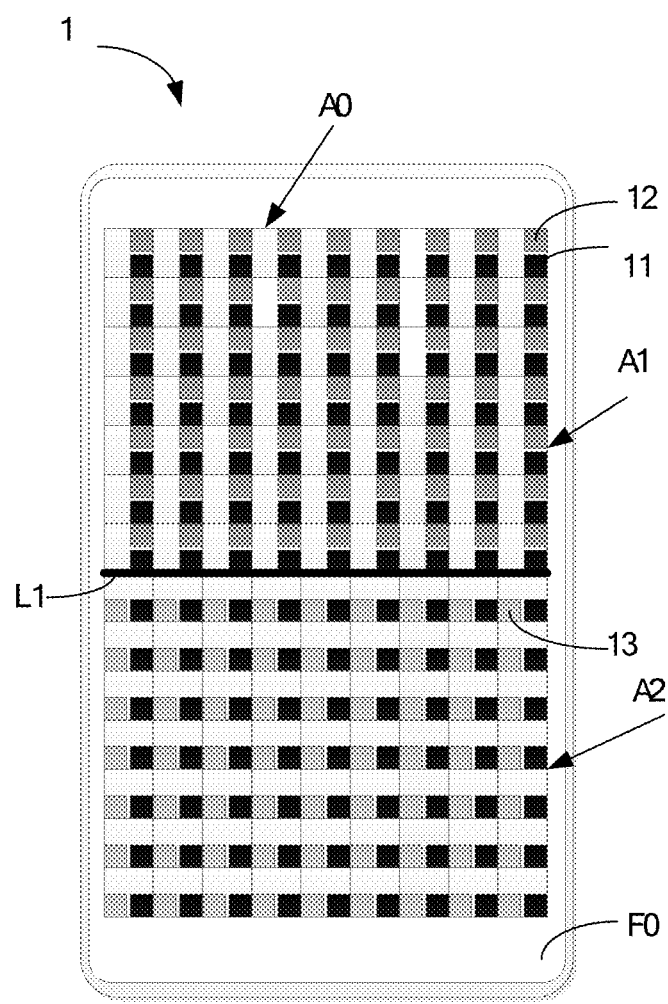
FIG. 3 is a schematic structural diagram illustrating a display screen according to an additional embodiment of the present disclosure.

As illustrated in FIG. 3, the first area A1 occupies half of the display area A0, and the second area A2 occupies the other half area of the display area A0.

In some embodiments, the first area A1 and the second area A2 are two symmetrical areas with respect to a center line L1 of the display area A0. The center line L1 is parallel to one side of the display area A0. By way of example, as shown in FIG. 3, the first area A1 is in an upper half area of the display area A0, and the second area A2 is in a lower half area of the display area A0. The first area A1 and the second area A2 are symmetrical with respect to the center line L1. In at least one alternative embodiment, the first area A1 may be in a left half area of the display area A0, and the second area A2 may be in a right half area of the display area A0.

In some embodiments, the first area A1 and the second area A2 may be two symmetrical areas with respect to a diagonal of the display area A0. By way of example, the display area A0 may be divided into two areas by a diagonal defined between an upper left corner and a lower right corner. The first area A1 may be in a lower left area of the display area A0, and the second area A2 may be in an upper right area of the display area A0.

In some embodiments, each of the display unit 11 includes an infrared emitting element 12 in the first area A1, and each of the display units 11 includes a photosensitive element 13 in the second area A2. In the first area A1, the number of the infrared emitting element 12 may be equal to the number of the display unit 11. In the second area A2, the number of the photosensitive element 13 may be equal to the number of the display unit 11. In other embodiments, the number of the infrared emitting element 12 may be different than the number of the display unit 11 in the first area A1. The number of the photosensitive element 13 may be different to the number of the display unit 11 in the second area A2.

In some embodiments, each of the display unit 11 corresponds to a pixel of the display screen 1. The number of the display unit 11 is determined by the resolution of the display screen 1.

In some embodiments, the plurality of infrared emitting elements 12 embedded in the first area A1 is configured to emit infrared light for illuminating the target object in front of the display screen 1. The infrared light reflected by the target object can form the target light spots. The plurality of photosensitive elements 13 is configured to receive the target light spots and convert the target light spots into photo-electrical signals suitable for generating a target image for identifying 3D feature of the target object.

In the present disclosure, the display screen may be an Organic Light Emitting Diode (OLED) display. Each of the display unit 11 includes one or more organic light emitting diode.

In some embodiments, the display screen may be a Liquid crystal display (LCD). Each of the display unit 11 includes three liquid crystal units, a red color filter, a green color filter and a blue color filter, each of the red color filter, the green color filter and the blue color filter being positioned above one of the liquid crystal unit so as to form a display unit 11 including a red sub-pixel, a green sub-pixel and a blue sub-pixel.

In the present disclosure, the photosensitive elements 13 can be infrared photosensitive devices such as infrared CCD (Charge Coupled Device) photodiodes or infrared CMOS (Complementary Metal-Oxide-Semiconductor) photodiodes. Each of the plurality of photosensitive elements 13 equivalents to a photosensitive pixel of an image sensor, accordingly, photo-electrical signals generated by all of the plurality of photosensitive elements 13 embedded in the display area of the display screen 1 can be used for generating a complete image. The plurality of infrared emitting elements 12 can be infrared light-emitting diodes, and each of the plurality of infrared emitting elements 12 comprises one or more infrared light-emitting diodes.

As illustrated in FIG. 1, in some embodiments, the display screen 1 may include a non-display area F0 surrounding the display area A0. Since the 3D feature recognition assembly, such as the plurality of infrared emitting elements 12 and the plurality of photosensitive elements 13, is embedded in the display area A0 of the display 1, the non-display area can be reduced to much smaller than a traditional display screen. In other embodiments, the non-display area can be eliminated, the display screen may include a display area only, so as to realize a real full screen.

Figure 4:
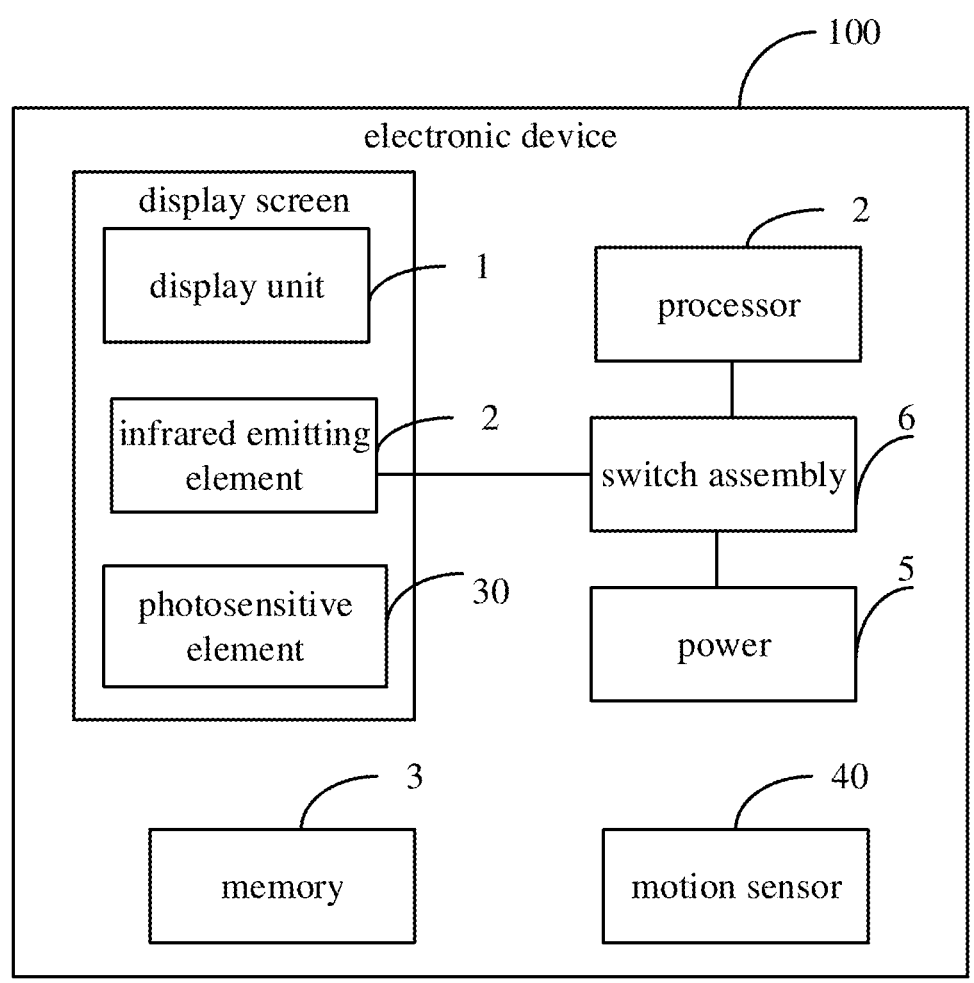
FIG. 4 is a schematic structural diagram illustrating an electronic device according to an embodiment of the present disclosure.

FIG. 4 illustrates a schematic structural diagram of an electronic device according to an embodiment of the present disclosure. The electronic device 100 includes the display screen 1 and a processor 2.

As illustrated in some embodiments, the display screen 1 includes a plurality of display units 11 distributed in an array throughout a display area A0 of the display screen 1. A plurality of infrared emitting elements 12 is embedded in a first area A1 of the display area A0 of the display screen 1. A plurality of photosensitive elements 13 is embedded in a second area A2 of the display area A0 of the display screen 1. The plurality of photosensitive elements 13 is combined into an image sensor. The plurality of infrared emitting elements 12 is configured to emit infrared light for illuminating a target object in front of the display screen 1, such that a plurality of light spots is formed on the target object. The plurality of photosensitive elements 13 is configured to receive target light spots reflected from the target object in response to the plurality of light spots and convert the target light spots into photo-electrical signals.

The processor 2 is electrically connected to the plurality of photosensitive elements 13. The processor 2 is configured to perform an image processing operation to obtain a target image according to the photo-electrical signals generated by the plurality of photosensitive elements 13, and identify 3D features of the target object according to the target image.

In some embodiments, the processor 2 identifies 3D features of the target object according to the target image. The identification of the 3D features can include: comparing the target image with a reference image, determining an offset of the light spots in the target image relative to the light spots in the reference image, and/or extracting 3D features of the target object such as depth information according to the determined offset.

In some embodiments, the plurality of photosensitive elements 13 receives the target light spots reflected from the target object in response to the plurality of light spots and convert the target light spots into photo-electrical signals which can indicate location information of the plurality of light spots. The processor 2 performs an image processing operation to obtain a target image which contains the location information according to the photo-electrical signals generated by the plurality of photosensitive elements 13. The reference image may also contains reference location information of a plurality of reference light spots.

The processor 2 extracts location information of the plurality of light spots form the target image and extracts reference location information of the plurality of reference light spots from the reference image. The processor 2 can compares the location information with the reference location information to determine an offset between the location information and the reference location information.

Figure 5:
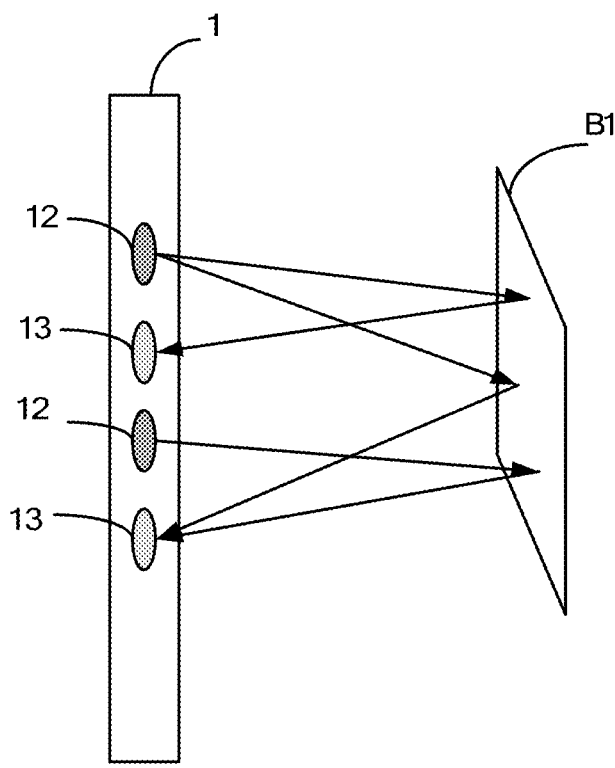
FIG. 5 is a schematic diagram of a generating process of a reference image according to an embodiment of the present disclosure.

FIG. 5 illustrates a schematic diagram of a target image generating process of a target object according to an embodiment of the present disclosure. A reference object B1 is positioned in front of the display screen 1 in a plane parallel to the display screen 1. The plurality of infrared emitting elements 12 emits reference infrared light to illuminate the reference object B1, such that a plurality of reference light spots is formed on the reference object B1. The plurality of photosensitive elements 13 receives light spots reflected from the reference object B1 in response to the plurality of reference light spots and converts the received light spots into reference photo-electrical signals. The processor 2 performs an image processing operation to obtain a reference image according to the reference photo-electrical signals.

In the present disclosure, the reference image is obtained by positioning a reference object in front of the display screen 1 in a plane parallel to the display screen 1, emitting reference infrared light to illuminate the reference object by the plurality of infrared emitting elements 12 to form a plurality of reference light spots on the reference object; receiving the reference target light spots reflected from the reference object in response to the plurality of reference light spots by the plurality of photosensitive elements 13; converting the reference target light spots into reference photo-electrical signals by the plurality of photosensitive elements 13; and performing image processing operation according to the reference photo-electrical signals.

In some embodiments, the reference object B1 may be a two-dimensional face image. By performing an imaging processing operation according to the photo-electrical signals obtained from the reference object B1, reference location information of the plurality of reference light spots can be determined without depth information.

Figure 6:
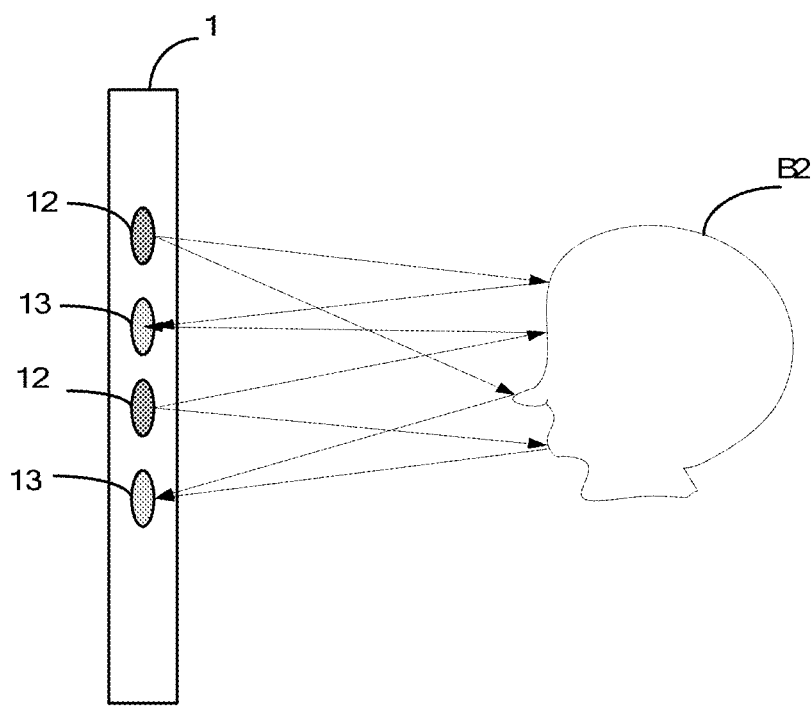
FIG. 6 is a schematic diagram of a target image generating process of a target object according to an embodiment of the present disclosure.

FIG. 6 illustrates a schematic diagram of a target image generating process of a target object according to an embodiment of the present disclosure. When a target object B2 such as an user's face is positioned in front of the display screen 1, due to the unevenness of the user's face, infrared light emitted by the plurality of infrared emitting elements 12 illuminate the user's face such that a plurality of light spots is formed on the user's face. The location of target light spots which are reflected from the user's face in response to the plurality of light spots projected on the display screen 1 may has an offset corresponding to the location of reference target light spots which are reflected from the two-dimensional face image. The size of the offset is determined by the depth information of the user's face.

In some embodiments, when different targets such as different user's face are positioned in front of the display screen 1, due to differences in facial contours, light spots formed on the user's face may be reflected and from different target light spots projected on different photosensitive elements 13, and received by different photosensitive elements 13. Each of the photosensitive element 13 may correspond to a pixel for forming the target image. As a result, when different photosensitive element 13 receive different target light spots, the location of the target light spot may be different in the target image.

As a result, the processor 2 compares the target image with the reference image, determines the offset of the plurality of target light spots in the target image corresponding to the plurality of reference target light spots in the reference image, and extracts the 3D features such as depth information of the target object according to the offset.

In some embodiments, an incident angle of the infrared light emitted by the plurality of infrared emitting elements 12 may be in a reference angel range corresponding to a normal line vertical to a display plane of the display screen 1, such as in an angel range smaller than 40 degree.

In some embodiments, the processor 2 extracts the 3D features such as depth information of the target object according to the offset. The extraction of the 3D features can further include: obtaining depth information of the target object according to the determined offset of the light spots; obtaining plane information according to plane data of the target image which is obtained through an imaging processing performed by the processor 2 according to the photo-electrical signal; and further obtaining the 3D features according to the depth information and the plane information. In some embodiments, the plane information can include color information (e.g., color channel data) of the target image.

As illustrated in FIG. 4, in some embodiments, the electronic device 100 further includes a memory 3, the memory 3 is configured to store a correspondence between a reference offset and depth information.

The processor 2 extracts the 3D features such as depth information of the target object according to the offset. The extraction may further include obtaining depth information of the target object corresponding to the determined offset of the light spots according to the correspondence between the offset and the depth information.

In one embodiment, the target object may be a user's face. The processor 2 may be further configured to control the plurality of infrared emitting elements 12 to emit infrared light to the front of the display screen 1 when receiving an input operation requesting face recognition verification. In some embodiments, the plurality of infrared emitting elements 12 is in a standby state, and configured to emit infrared light to the front of the display screen 1 when the processor 2 received an input operation requesting face recognition verification.

As illustrated in FIG. 4, the electronic device further includes a motion sensor 4. The motion sensor 4 is electrically connected to the processor 2, and is configured to detect whether the electronic device 100 is moving. When the motion sensor 4 detects that the electronic device 100 is moving, and the display screen 1 is in a locked state, the processor 2 determines that a face recognition verification process is needed to unlock the display screen 1 when receiving an input operation requesting face recognition verification. Here, the motion sensor 4 may be a sensor such as an accelerometer or a gyroscope.

In other embodiments, the input operation requesting face recognition verification may be configured for account login verification or payment operation verification.

In some embodiments, reference 3D feature information such as 3D face feature information may be stored in the memory 3. The processor 2 is further configured to compare 3D feature information of the target object with the reference 3D feature information when the 3D feature information of the target object is identified. After confirming that the 3D feature information of the target object matches the reference 3D feature information, the processor 2 can execute subsequent operations, such as account login verification or payment operation verification.

As illustrated in FIG. 4, the electronic device further includes a power 5 and a switch assembly 6. The switch assembly 6 is connected between the plurality of infrared emitting elements 12 and the power 5. The processor 2 controls the switch assembly 6 to enable the connection between the power 5 and the plurality of infrared emitting elements 12 when received an input operation requesting face recognition verification, then an operating voltage may be applied to the plurality of infrared emitting elements 12 to excite the plurality of infrared emitting elements 12 to emit infrared light to the front of the display screen 1.

In one embodiment, the switch assembly 6 may be a digital control switch, such as a MOSFET or a BJT transistor.

In one embodiment, the front of the display screen 1 indicates a side of the display screen 1 which is configured for displaying information.

In one embodiment, the memory 3 is further configured to store computer program instruction, the computer program instruction is configured to be called by the processor 2 and perform functions as mentioned in at least one of the embodiments of the present disclosure.

In one embodiment, the processor 2 may be a central processing unit integrated with function of image processing. The memory 3 may be a solid state memory, a memory card or other storage devices.

In the present disclosure, the electronic device 100 may be handheld devices with wireless communication capabilities, in-vehicle devices, wearable devices, computing devices or other processing devices connected to wireless modems, various forms of user equipment, mobile stations, and terminal devices etc. For convenience of description, the above mentioned devices are referred to as electronic devices in the present disclosure.

Figure 7:
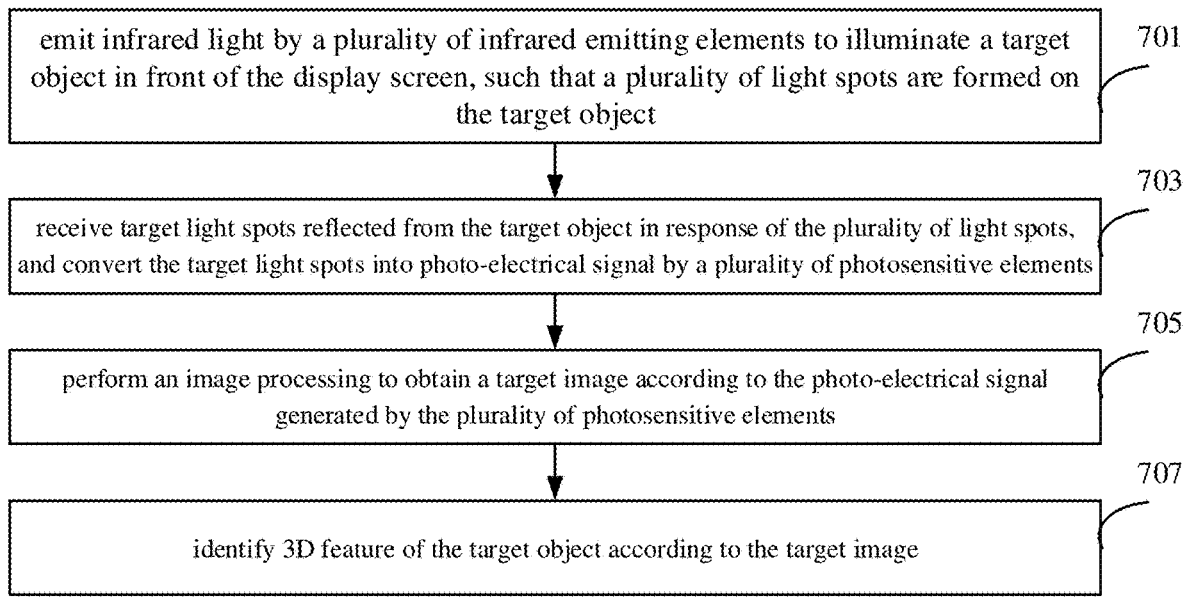
FIG. 7 is a flow chart of a 3D feature recognition method according to an embodiment of the present disclosure.

As illustrated in FIG. 7, a method for 3D feature recognition is further provided in the present disclosure. The method can be applied in the electronic device 100. The method may include operations at blocks illustrated in FIG. 7.

At block 701, emit infrared light by a plurality of infrared emitting elements 12 to illuminate a target object in front of the display screen 1, such that a plurality of light spots is formed on the target object. In some embodiments, the target object may be a user's face. The block 701 may further include: controlling the plurality of infrared emitting elements 12 to emit infrared light to the front of the display screen 1 when receiving an input operation requesting face recognition verification, so as to illuminate a target object in front of the display screen 1, and forming a plurality of light spots on the target object.

In some embodiments, the receiving an input operation requesting face recognition verification may include: determining that an input operation requesting face recognition verification is received when a motion sensor 4 detects that the electronic device 100 is moving, and the display screen 1 is in a locked state.

In other embodiments, the receiving an input operation requesting face recognition verification may include: determining that an input operation requesting face recognition verification is received when an account login verification request or a payment operation verification request is received.

At block 703, receiving target light spots reflected from the target object in response to the plurality of light spots, and converting the target light spots into photo-electrical signal by a plurality of photosensitive elements 13.

At block 705, performing an image processing operation to obtain a target image according to the photo-electrical signal generated by the plurality of photosensitive elements 13.

At block 707, identifying 3D feature of the target object according to the target image.

In some embodiments, the method may include: comparing 3D feature information of the target object with reference 3D feature information when the 3D feature information of the target object is identified. The method may further includes, after confirming that 3D feature information of the target object matches the reference 3D feature information, performing subsequent operations, such as account login verification or payment operation verification.

Figure 8:
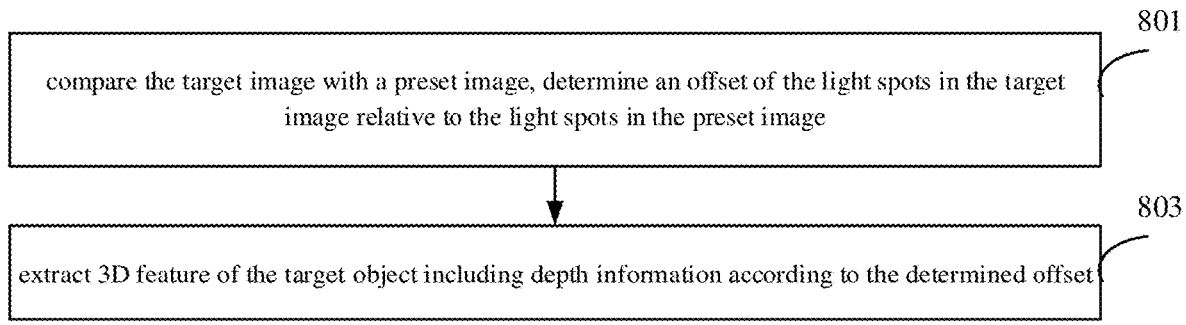
FIG. 8 is a sub-flow chart of operation illustrated at block 707 in FIG. 7 according to an embodiment of the present disclosure.

FIG. 8 illustrates a sub-flow chart of operation illustrated at block 707 in FIG. 7 according to an embodiment of the present disclosure. The operation illustrated at block 707 may further include operations at blocks illustrated in FIG. 8.

At block 801, comparing the target image with a reference image, determining an offset of the light spots in the target image relative to the light spots in the reference image.

At block 803, extracting 3D feature of the target object such as depth information according to the determined offset.

In some embodiments, the method may further include: positioning a reference object in front of the display screen 1 in a plane parallel to the display screen 1; emitting reference infrared light to illuminate the reference object by the plurality of infrared emitting elements 12, such that a plurality of reference light spots is formed on the reference object; receiving reference target light spots reflected from the reference object in response of the plurality of reference light spots, converting the reference target light spots into reference photo-electrical signals by the plurality of photosensitive elements 13; and performing image processing operation to obtain the reference image according to the reference photo-electrical signals.

In the present disclosure, the reference image is obtained by positioning a reference object in front of the display screen 1 in a plane parallel to the display screen 1, emitting reference infrared light to illuminate the reference object by the plurality of infrared emitting elements 12 to form a plurality of reference light spots on the reference object; receiving the reference target light spots reflected from the reference object in response to the plurality of reference light spots by the plurality of photosensitive elements 13; converting the reference target light spots into reference photo-electrical signal by the plurality of photosensitive elements 13; and performing an image processing operation according to the reference photo-electrical signal.

In some embodiments, extracting 3D features of the target object that include depth information according to the determined offset may further includes: obtaining depth information of the target object according to the determined offset of the light spots; obtaining plane information according to plane data of the target image which is obtained through imaging processing according to the photo-electrical signals, and further obtaining the 3D feature according to the depth information and the plane information.

In some embodiments, extracting 3D features of the target object that include depth information according to the determined offset may further include: obtaining depth information of the target object corresponding to the determined offset of the light spots according to the correspondence between the offset and the depth information.

A computer storage medium is further provided according to an embodiments of the present disclosure. The computer storage medium stores computer programs for electronic data exchange. The computer programs cause a computer to perform some or all of the steps of any of the methods described in the foregoing method embodiments.

A computer program product is provided in embodiments of the present disclosure. The computer program product includes a non-transitory computer readable storage medium storing a computer program. The computer program can be operated to cause a computer to perform some or all of the steps of any of the methods described in the foregoing method embodiments.

It should be noted that, for the foregoing method embodiments, for the sake of brevity, they are all described as a series of action combinations, but those skilled in the art should understand that the present disclosure is not limited by the described action sequence. Because certain steps may be performed in other sequences or concurrently in accordance with the present disclosure. In the following, those skilled in the art should also understand that the embodiments described in the specification are all preferred embodiments, and the actions and circuits involved are not necessarily required by the present disclosure.

In the above embodiments, the descriptions of the various embodiments are all focused on, and the parts that are not detailed in a certain embodiment can be referred to the related descriptions of other embodiments.

In addition, the processor that performs the method steps in the foregoing method embodiments may integrated with a plurality of functional units to perform each of the step, or each of the functional unit may be a physical element. For example, the electronic device 100 may include multiple controllers to perform each of the step separately. The above integrated functional unit can be implemented in the form of hardware or in the form of a software functional module.

The above-described integrated unit can be stored in a computer readable memory if it is implemented in the form of a software functional unit and sold or used as a standalone product. Based on such understanding, the technical solution of the present disclosure, in essence or the contribution to the prior art, or all or part of the technical solution may be embodied in the form of a software product. The software product is stored in a memory, which includes a number of instructions causing a computer device (which may be a personal computer, server or network device, etc.) to perform all or some of the steps of the above-described methods of various embodiments of the present disclosure. The foregoing memory includes various mediums that can store program codes, such as a U disk, a Read-Only Memory (ROM), a Random Access Memory (RAM), a removable hard disk, a magnetic disk, or an optical disk, and the like.

One of ordinary skill in the art can understand that all or part of the various methods of the above embodiments can be completed by related hardware instructed by a program. The program can be stored in a computer readable memory, and the memory can include a flash drive, read-only memory (ROM), random access memory (RAM), disk or CD, etc.

The description of the above embodiments is only preferred implementations of the present disclosure, it should be noted that, for a person skilled in the art, improvements and modifications may be made without departing from the principles of the present disclosure, these improvements and modifications are also considered to be within the scope of the present disclosure.

What is claimed is:

1. A display screen, comprising:
   a plurality of display units distributed in an array across a display area of the display screen;
   a plurality of infrared emitting elements embedded in a first area of the display area, the plurality of infrared emitting elements configured to emit infrared light for illuminating a target object in front of the display screen so as to form a plurality of light spots on the target object; and a plurality of photosensitive elements embedded in a second area of the display area of the display screen, the plurality of photosensitive elements configured to receive target light spots reflected from the target object and convert the target light spots into photo-electrical signals suitable for generating a target image of the target object;

wherein the first area and the second area overlap, a size of at least one of the first area or the second area is greater than or equal to half of the display area and less than the display area, and wherein in an overlapped area formed by the first area and the second area, each of the display units comprises at least one of the plurality of infrared emitting elements and at least one of the plurality of photosensitive elements, or the first area is in a first half of the display area, and wherein the second area is in a second half of the display area, and wherein each of the plurality of display units in the first area comprises at least one of the plurality of infrared emitting elements, and each of the plurality of display units in the second area comprises at least one of the plurality of photosensitive elements.

2. An electronic device, comprising:
a display screen that includes:
   a plurality of display units distributed in an array across a display area of the display screen,
   a plurality of infrared emitting elements embedded in a first area of the display area, and
   a plurality of photosensitive elements embedded in a second area of the display area,
   wherein the plurality of infrared emitting elements is configured to emit infrared light for illuminating a target object in front of the display screen so as to form a plurality of light spots on the target object, and
   wherein the plurality of photosensitive elements is configured to receive target light spots reflected from the target object and convert the target light spots into photo-electrical signals; and
a processor electrically connected to the plurality of photosensitive elements, the processor configured to perform an image processing operation to obtain a target image according to the photo-electrical signals generated by the plurality of photosensitive elements, and to identify one or more 3D features of the target object according to the target image;
wherein the first area and the second area overlap, a size of at least one of the first area or the second area is greater than or equal to half of the display area and less than the display area, and wherein in an overlapped area formed by the first area and the second area, each of the display units comprises at least one of the plurality of infrared emitting elements and at least one of the plurality of photosensitive elements, or
the first area is in a first half of the display area, and wherein the second area is in a second half of the display area, and wherein each of the plurality of display units in the first area comprises at least one of the plurality of infrared emitting elements, and each of the plurality of display units in the second area comprises at least one of the plurality of photosensitive elements.

3. The electronic device of claim 2, wherein the processor is configured to identify the one or more 3D features of the target object according to the target image by:
   comparing the target image with a reference image,
   determining an offset of the target light spots in the target image relative to light spots in the reference image;
   extracting the one or more 3D features of the target object according to the determined offset, wherein the one or more 3D features include depth information of the target object.

4. The electronic device of claim 3, wherein the reference image is obtained by:
   emitting reference infrared light to illuminate a reference object by the plurality of infrared emitting elements to form a plurality of reference light spots on the reference object, wherein the reference object is located in front of the display screen and in parallel to the display screen;
   receiving light spots reflected from the reference object;
   converting the received light spots into reference photo-electrical signals by the plurality of photosensitive elements; and
   performing an image processing operation according to the reference photo-electrical signals.

5. The electronic device of claim 3, wherein the processor is further configured to:
   determining depth information of the target object according to the determined offset of the light spots;
   determining plane information according to plane data of the target image, wherein the plane data of the target image is obtained through the imaging processing operation performed by the processor according to the photo-electrical signals; and
   determining the one or more 3D features according to the depth information and the plane information.

6. The electronic device of claim 2, wherein a number of the plurality of infrared emitting elements and a number of the plurality of photosensitive elements are equal to each other and greater or smaller than a number of the plurality of display units.

7. The electronic device of claim 2, wherein the target object includes a face of a user, and wherein the processor is further configured to:
   control the plurality of infrared emitting elements to emit infrared light to the front of the display screen upon receiving an input operation requesting face recognition verification.

8. The electronic device of claim 7, wherein the electronic device further comprises a power and a switch assembly, the switch assembly connected between the plurality of infrared emitting elements and the power, and wherein the processor is further configured to:
   control the switch assembly to enable a connection between the power and the plurality of infrared emitting elements upon receiving an input operation requesting face recognition verification so as to apply an operating voltage to the plurality of infrared emitting elements to excite the plurality of infrared emitting elements to emit infrared light to a front of the display screen.

\* \* \* \* \*